(12) United States Patent
Schäfer

(10) Patent No.: US 7,139,206 B2
(45) Date of Patent: Nov. 21, 2006

(54) MEMORY COMPONENT WITH IMPROVED NOISE INSENSITIVITY

(75) Inventor: Andre Schäfer, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/031,740

(22) Filed: Jan. 7, 2005

(65) Prior Publication Data
US 2005/0179492 A1    Aug. 18, 2005

(30) Foreign Application Priority Data
Jan. 9, 2004    (DE)    ............. 10 2004 001 434

(51) Int. Cl.
*G11C 7/02* (2006.01)

(52) U.S. Cl. .................... 365/207; 365/226
(58) Field of Classification Search ............. 365/207
See application file for complete search history.

(56) References Cited

U.S. PATENT DOCUMENTS

| 5,958,026 A | 9/1999 | Goetting et al. |
|---|---|---|
| 6,310,796 B1 | 10/2001 | Song |
| 6,366,506 B1 | 4/2002 | Mizuno et al. |
| 6,366,513 B1 * | 4/2002 | Wang .................. 365/210 |
| 6,393,343 B1 * | 5/2002 | Frey et al. ................. 701/3 |
| 6,621,759 B1 * | 9/2003 | Waller ............... 365/230.06 |

OTHER PUBLICATIONS

German Patent Office Examination Report dated Sep. 6, 2004.

* cited by examiner

*Primary Examiner*—Thong Q. Le
(74) *Attorney, Agent, or Firm*—Patterson & Sheridan, L.L.P.

(57) ABSTRACT

A memory component comprises a memory cell array, signal inputs, input amplifiers connected to respective ones of the signal inputs, for receiving, amplifying and outputting data, address or control signals, a data, address or control signal generator for the memory cell array, a first supply network for supplying power to the input amplifiers and a second supply network for supplying power to the data, address or control signal generator, wherein the first supply network and the second supply network do not have a direct connection.

16 Claims, 1 Drawing Sheet

MEMORY COMPONENT WITH IMPROVED NOISE INSENSITIVITY

CROSS-REFERENCE TO RELATED APPLICATIONS

This application claims foreign priority benefits under 35 U.S.C. §119 to co-pending German patent application number DE 10 2004 001 434.5-55, filed 9 Jan. 2004. This related patent application is herein incorporated by reference in its entirety.

BACKGROUND OF THE INVENTION

1. Field of the Invention

The present invention relates to a memory component and particularly to a memory component with improved noise insensitivity of the input amplifiers or receivers, respectively.

2. Description of the Related Art

In previous memory components, the noise sensitivity of the input amplifiers does not represent a limiting factor or a decisive characteristic of the performance of the input amplifiers due to the low speed of the data exchange with external data sources, for example, with a bus or a processor. For this reason, the noise sensitivity of the input amplifiers has not yet been investigated in greater detail or optimized.

High performance input amplifiers of present-day high-speed dynamic Random Access Memories or DRAMs, for example, DDRII SDRAMs, or graphics chips provide a data exchange at speeds or data rates which are so high that the performance of the high performance input amplifiers is restricted by noise being coupled in via the supply, signal and reference signal connections.

Thus, there is a need for an improved memory component which exhibits improved insensitivity particularly with respect to the coupling-in of noise.

SUMMARY OF THE INVENTION

One embodiment of the present invention provides a memory component comprising a memory cell array, signal inputs, input amplifiers which are respectively connected to the signal inputs, for receiving, amplifying and outputting data, address or control signals, a data, address or control signal generator for the memory cell array, a first supply network for supplying power to the input amplifiers and a second supply network for supplying power to the data, address or control signal generator wherein the first supply network and the second supply network do not exhibit a direct connection.

The memory component according to one embodiment of the invention may also exhibit a first external power input which is connected to the first supply network, and a second external power input which is connected to the second supply network.

As an alternative, in the memory component according to another embodiment of the invention, the first supply network is connected to a first external power input via a first input inductance, and the second supply network is connected to the first external power input or to a second external power input via a second input inductance.

Embodiments of the present invention are based on the finding that a considerable proportion of the noise and of the other disturbances which are coupled onto the input amplifiers of the memory component are generated from switching processes in and on data, address and control signal generators of the memory cell array and by other circuits of the so-called core/logic area. Furthermore, embodiments of the present invention are based on the finding that these disturbances are primarily and very directly transferred via the supply network of the memory component. On the basis of these findings, embodiments of the present invention are based on the concept of providing two supply networks which are separated from one another, one of which supplies (preferably exclusively) the input amplifiers and the other one of which preferably supplies the entire core/logic area or at least its most intensive noise sources, especially the data, address and control signal generators of the memory cell array.

An advantage provided by embodiments of the present invention is that due to the separation of the supply network for the input amplifiers from the supply network of the core/logic area, a transmission of the disturbances from the core/logic area to the input amplifiers is largely reduced or suppressed. Supplying the separate supply networks via separate power inputs is particularly advantageous in this connection because the supply voltages of the two supply networks can be optimally stabilized and decoupled from one another by means of external circuits. However, connecting the two supply networks to the same external power input via two separate input inductances also results in largely decoupling the supply networks.

According to one exemplary embodiment of the present invention, the supply network to which the input amplifiers are connected is also constructed and matched in such a manner that its transfer function corresponds to the transfer function of each signal input and of a reference signal input. The consequence of identical transfer functions of the signal inputs, of the reference signal input, of the power input and of the supply network is that disturbances coupled onto the signal inputs, the reference signal input and the power input from external noise and disturbance sources are received in phase at corresponding inputs of the input amplifiers. Disturbances received in phase essentially cancel or compensate for one another. This makes it possible to greatly reduce the effect not only of disturbances which are generated within the memory component, but also of those which are generated or coupled-in from outside the memory component.

BRIEF DESCRIPTION OF THE DRAWINGS

In the text which follows, preferred exemplary embodiments of the present invention are explained in greater detail with reference to the attached figure, in which.

DETAILED DESCRIPTION OF THE PREFERRED EMBODIMENT

Figure 1:
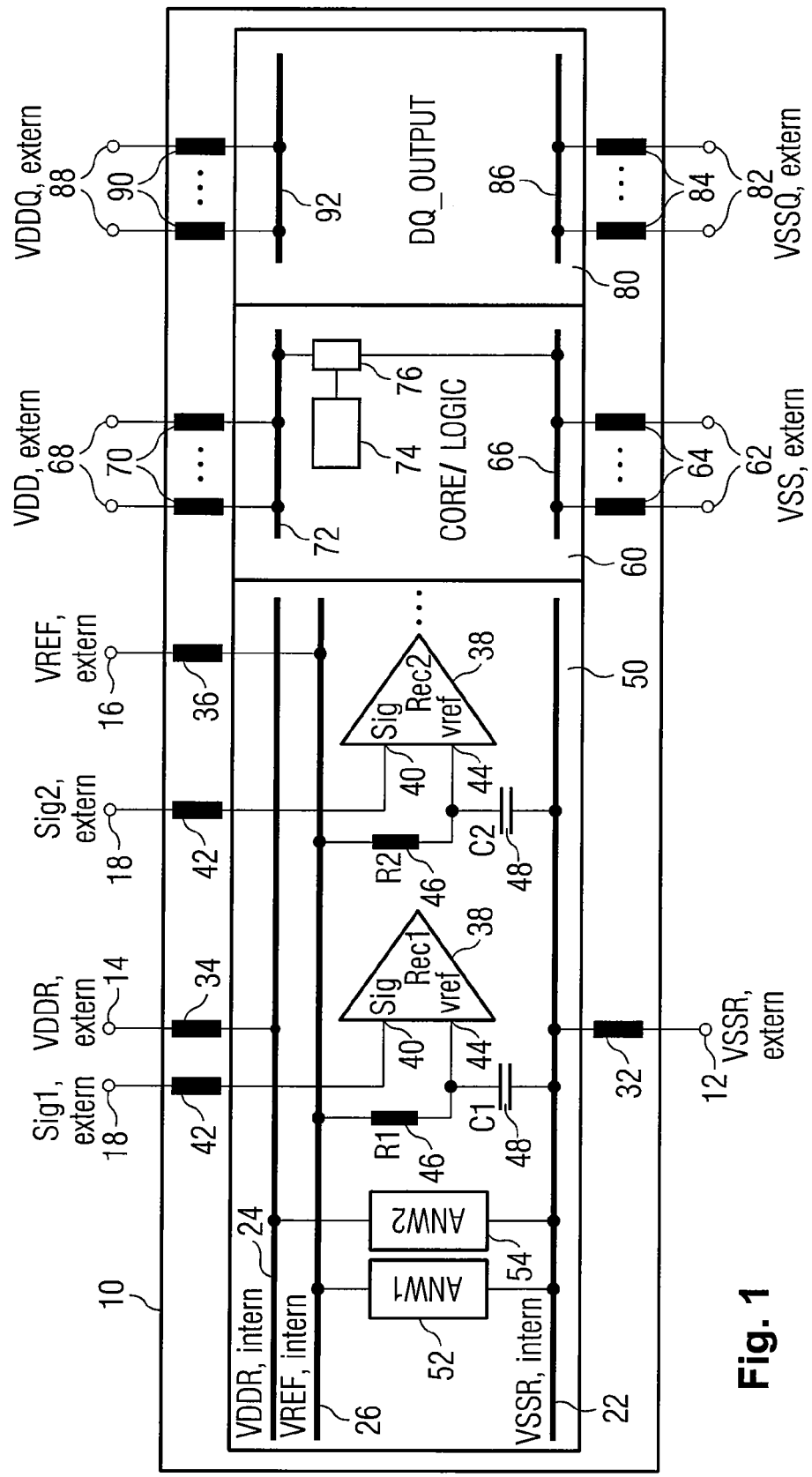
FIG. 1 shows a schematic circuit diagram of a memory component according to one exemplary embodiment of the present invention.

FIG. 1 is a schematic circuit diagram which shows a memory component 10 according to a preferred exemplary embodiment of the present invention. The memory component 10 includes a first connecting contact 12 to which a ground potential (ground) $V_{SSR,ext}$ is applied. Furthermore, the memory component 10 includes a second connecting contact 14 to which a supply voltage $V_{DDR,ext}$ is applied from outside (relative to the first connecting contact). Furthermore, the memory component 10 includes a third connecting contact 16 to which a reference potential or a reference voltage $V_{REF,ext}$ is applied from outside (relative to the first connecting contact 12). Furthermore, the memory component 10 includes fourth connecting contacts 18 to which signals $Sig_{1,ext}$, $Sig_{2,ext}$, etc., are applied from outside.

The second connecting contact 14 and the first connecting contact 12 form a power input. The third connecting contact 16 and the first connecting contact 12 form a reference voltage input, and each of the fourth connecting contacts 18 forms a signal input together with the first connecting contact 12. To simplify, the second connecting contact 14 alone is also called a power input. The third connecting contact 16 alone is called a reference voltage input, and each individual fourth connecting contact 18 alone is called a signal input. As shown, the voltages are measured relative to the first connecting contact 12.

Furthermore, the memory component 10 includes potential rails or circuit tracked patterns 22, 24, 26 which are connected via respective input inductance 32, 34, 36 to respective connecting contact 12, 14, 16. The first potential rail 22 is connected to the first connecting contact 12 via the first input inductance 32. The potential $V_{SSR,int}$ of the first potential rail 22 can, therefore, deviate from the externally applied ground potential $V_{SSR,ext}$. The second potential rail 24 is connected to the second connecting contact 14 via the second input inductance 34. The potential $V_{DDR,int}$ of the second potential rail 24 can, therefore, deviate from the externally applied supply potential $V_{DDR,ext}$. The third potential rail 26 is connected to the first connecting contact 16 via the third input inductance 36. The potential $V_{REF,int}$ of the third potential rail 26 can, therefore, deviate from the externally applied ground potential $V_{REF,ext}$. The input inductances 32, 34, 36 may be parasitic (line) inductances or also may be dedicated integrated or discrete components, or may include proportions of both. In particular, the input inductances influence the transmission of rapidly varying signals, for example, disturbance signals, to the potential rails 22, 24, 26 from outside.

Furthermore, the memory component 10 includes input amplifiers 38 (Rec1, Rec2, etc.). Each input amplifier 38 comprises a first input connection 40 (Sig) which is connected via respective fourth input inductance 42 to respective one of the fourth connecting contacts 18, and a second input connection 44 (vref) which is respectively connected via a respective resistor 46 (R1, R2, etc.) to the third rail 26 and via a respective capacitor 48 (C1, C2, etc.) to the first rail 22. The continuation dots 50 indicate that the memory component 10 may include further input amplifiers 38 which are correspondingly connected to further fourth connecting contacts 18, to the first potential rail 22 and to the third potential rail 26. To provide a clear illustration, however, further connections are not shown in FIG. 1, for example, connections between the first potential rail 22 and the second potential rail 24, on the one hand, and the input amplifiers 38, on the other hand.

The memory component 10 further comprises a first adapting network 52 (ANW1), which is connected between the third potential rail 26 and the first potential rail 22, and a second adapting network 54 which is connected between the second potential rail 24 and the first potential rail 22.

Furthermore, the memory component 10 comprises a core/logic area 60 which comprises, among other things, one or more memory cell arrays, associated data, address and control signal generators, instruction and address decoders, etc. The memory component 10 comprises one or more fifth connecting contacts 62 which are connected via respective fifth input inductances 64 to a fourth potential rail 66 of the core/logic area 60, and one or more sixth connecting contacts 68 which are connected via respective sixth input inductances 70 to a fifth potential rail 72 of the core/logic area 60. A ground potential $V_{SS,ext}$ may be applied to the fifth connecting contact or contacts 62 from outside. A supply potential $V_{DD,ext}$ may be applied to the sixth connecting contact or contacts 68 from outside.

The core/logic area 60 also comprises, in particular, a memory cell array 74 and a data, address or control signal decoder or generator 76 which is connected to the fifth potential rail 72 and the fourth potential rail 66 and receives electrical power via these rails.

Furthermore, the memory component 10 comprises an output driver area 80 which primarily comprises a row of output drivers or amplifiers, not shown, which drive or amplify signals to be provided at data outputs, not shown, which represent data read out of the memory cell array 74 and/or status information of the memory component 10. The memory component 10 also comprises one or more seventh connecting contacts 82 which are connected to a sixth potential rail 86 of the output driver area 80 via respective seventh input inductances 84, and one or more eighth connecting contacts 88 which are connected to a seventh potential rail 92 of the output driver area 80 via respective eighth input inductances 90.

The first potential rail 22 and the second potential rail 24 form a first supply network via which the input amplifiers 38 are connected to the first connecting contact 12 and to the second connecting contact 14 and are supplied with electrical power. This supply network may comprise other components, particularly, for example, branches, not shown. The first and the second input inductance 32, 34 may also be included in the first supply network.

Correspondingly, the fourth potential rail 66 and the fifth potential rail 72 form a second supply network or at least a part of a second supply network for the core/logic area 60 via which the latter is connected to the connecting contacts 62, 68 and is supplied with electrical power. Correspondingly, the sixth potential rail 86 and the seventh potential rail 92 form a third supply network or at least a part of a supply network for the output driver area via which the latter is connected to the connecting contacts 82, 88 and is supplied with electrical power.

FIG. 1 shows that the first and the second supply networks are embodied as separate supply networks and more particularly, that the first and second supply networks are separated or isolated from one another. This separation between the supply networks means, in particular, that there is no direct coupling and only a minimum parasitic capacitive or inductive coupling between the supply networks.

When an input amplifier 38 switches, the internal level of the reference potential or of the potential $V_{REF,int}$, respectively, of the third potential rail 26 may vary due to capacitive coupling. This variation of the potential of the third potential rail 26 is one of the on-chip noise effects and is called a receiver kick-back noise. It can cause a variation in the switching characteristic in other input amplifiers 38. To prevent this influence or at least to minimize it, the second input connections 44 (vref) of the input amplifiers 38 are connected to the third potential rail 26 via low-pass filters. In particular, the second input connections 44 of the input amplifiers 38 are respectively connected to the third potential rail 26 via a respective resistor 46 (R1, R2, etc.) and to the first potential rail 22 via a respective capacitor 48 (C1, C2, etc.).

This circuit provides the effect of extensively decoupling the input amplifiers 38 from one another, but has the disadvantage that the input amplifiers 38 are capacitively coupled to the first potential rail 22 and its potential $V_{SSR,int}$ via their respective second input connections 44 and the capacitors 48. In the conventional connection, not shown, between the first potential rails 22 and the fourth potential rail 66 of the first supply network of the input amplifiers 38 and the second supply network of the core/logic area 60, respectively, the input amplifiers 38 and their performance are persistently impaired by a further on-chip noise effect, namely, the set noise. This is due to the fact that the power consumption of loads, particularly, for example, data, address or current signal generators 76 in the core/logic area 60, produce oscillations and other variations of the potentials $V_{SS,int}$, $V_{DD,int}$ of the fourth potential rail 66 and of the fifth potential rail 72. These disturbances are normally transferred into the area of the input amplifiers 38 via the conventional connection, not shown, between the first potential rail 22 and the fourth potential rail 66 and between the second potential rail 24 and the fifth potential rail 72. The disturbances are then transferred in various ways, particularly capacitively via the capacitors 48, to the second input connections 44 (vref) of the input amplifiers 38.

The set noise described could well be drastically reduced by removing the capacitors 44 or their coupling capacitances C1, C2, etc. However, this would result in a similar drastic increase in the abovementioned coupling between the input amplifiers 38. Furthermore, removal of the capacitors 48 in conjunction with the rejection of noise and other disturbance signals, described in the text which follows, the sources of which are outside the memory component 10, would be disadvantageous.

Apart from the on-chip influences described, namely the receiver kick-back noise and the set noise, noise and other disturbance signals generated outside the memory component 10 can influence the input amplifiers 38 and their performance. These disturbance signals are frequently coupled-in in-phase and with the same amplitude to the external power ground planes, i.e., the external potential rails for the ground potential, the supply potential and the reference potential, and to the external signal paths. The disturbance signals, therefore, result in primarily in-phase variations, oscillating at the same amplitude, of the potentials at the connecting contacts 12, 14, 16, 18 for the ground potential, the supply potential, the reference potential and the signal.

According to one embodiment of the present invention, the power input, the reference signal input and the signal inputs, and preferably all connecting contacts 12, 14, 16, 18, in each case together with the corresponding input inductances 32, 34, 36, 42, and the corresponding potential rails 22, 24, 26, include the same or mutually adapted or matching transfer functions for transmitting an externally induced signal to the input amplifiers 38. The effect is that disturbances induced externally in-phase and with the same amplitude also reach the input amplifiers 38 in-phase and with the same amplitude. The input connections 40, 44 and other input connections (not shown) of the input amplifiers 38 thus also oscillate or vary in-phase and with the same amplitude so that the potential difference between the input connections of the input amplifiers 38 are not influenced by the externally induced disturbance signals.

The adaptation or matching of the transfer function according to the present invention is effected by a suitable choice of the input inductances 32, 34, 36, 42 which follow the connecting contacts 12, 14, 16, 18, respectively. The transfer functions are preferably also adapted via a suitable choice of the coupling capacitances C1, C2, etc., of the capacitors 48. Furthermore, the use of suitable (e.g., passive) adapting networks 52, 54 (ANW1, ANW2), such as are known in other fields of the technology, may be advantageous.

Due to the division or separation of the supply networks for the input amplifiers 38 and the core/logic area 60, shown in FIG. 1, and the adapting of the transfer functions described, the coupling-in of internal and external noise and other disturbance events into the input amplifiers 38 is drastically reduced, and thus, the total performance of the DRAM is correspondingly enhanced. All input amplifiers provided in the memory component 10 may be connected to the first supply network formed from the first potential rail 22 and the second potential rail 24. This supply network may exclusively supply the input amplifiers 38 of the memory component 10. As an alternative, this supply network only supplies those input amplifiers which are particularly sensitive to the coupling-in of disturbances, for example, due to the characteristics of the external signal paths or due to the signal level applied or due to the data rate applied. Other input amplifiers which are less sensitive or have to process lower data rates are supplied via other supply networks in this case.

As an alternative, other circuits or circuit components which generate no disturbances or only very small disturbances or even result in a stabilization of the potentials $V_{SSR,int}$, $V_{DDR,int}$, $V_{REF,int}$ of the potential rails 22, 24, 26, for example, due to large input capacitances, are also supplied with electrical power via the first supply network.

Similarly, the transfer functions of all signal inputs and of the power input and of the reference signal input with the downstream input inductances 32, 34, 36, 42 and potential rails 22, 24, 26 may be identical with regard to a transmission of externally induced signals to the receivers 38. As an alternative, this only applies to those signal inputs and input amplifiers which are sensitive to externally coupled-in disturbances due to characteristics of external signal paths, the signal levels and data rates present. Input receivers which are insensitive to disturbances due to well-shielded (external) signal paths, high signal levels or low data transmission rates do not need to exhibit the same transfer function as the signal paths to sensitive input amplifiers.

In one embodiment, separate power inputs or connecting contacts 12, 14, 62, 68 are provided for the first supply network 22, 24 of the input amplifiers 38 and for the second supply network 66, 72 of the core/logic area 60. As an alternative, separate input inductances 32, 34, 64, 70 with a common external power input or common connecting contacts will be provided if, due to the input inductances 32, 34, 64, 70, adequate separation of the supply networks 22, 24, 66, 72 is provided which ensures adequate suppression of a transmission of disturbance signals from the core/logic area 60 to the input receivers 38.

While the foregoing is directed to embodiments of the present invention, other and further embodiments of the invention may be devised without departing from the basic scope thereof, and the scope thereof is determined by the claims that follow.

What is claimed is:

1. A memory component, comprising:
  a memory cell array;
  a plurality of signal inputs;
  a plurality of input amplifiers, respectively connected to the plurality of signal inputs, for receiving, amplifying and outputting at least one of data signals, address signals and control signals;
  a data/address/control signal generator for the memory cell array;

a first supply network for supplying power to the input amplifiers;

a second supply network for supplying power to the data/address/control signal generator;

a first external power input connected to the first supply network; and a second external power input connected to the second supply network;

wherein the first supply network and the second supply network are constructed as separate supply networks;

wherein the first supply network is connected to the first external power input via a first input inductance and the second supply network is connected to one of the first external power input and a second external power input via a second input inductance; and wherein signal paths via the signal inputs and a signal path via the first supply network and the first external power input have substantially identical transfer functions for a transmission of signals to the input amplifiers from outside the memory component.

2. The memory component of claim 1, wherein at least one of a resistive component, a capacitive component and an inductive component is connected to at least one of one or more signal inputs, the first supply network and the first external power input, wherein the at least one connected resistive, capacitive or inductive component is dimensioned in such a manner that transfer functions for the transmission of signals to the input amplifiers from outside of the memory component via the signal inputs and via the first supply network are substantially identical.

3. The memory component of claim 2, wherein the at least one connected resistive, capacitive or inductive component is integrated together with the input amplifiers on one semiconductor substrate.

4. The memory component of claim 2, wherein the at least one connected resistive, capacitive or inductive component is arranged together with the input amplifiers in one package.

5. A memory component, comprising:
a memory cell array;
a plurality of signal inputs;
a plurality of input amplifiers, respectively connected to the plurality of signal inputs, for receiving, amplifying and outputting at least one of data signals, address signals and control signals;
a data/address/control signal generator for the memory cell array;
a first supply network for supplying power to the input amplifiers; and
a second supply network for supplying power to the data/address/control signal generator;
wherein the first supply network and the second supply network are constructed as separate supply networks; and
wherein each of the signal inputs and each first power input respectively comprise one connecting contact, and wherein transfer functions for signal paths via each of the connecting contacts of the signal inputs and of the respective first power input to the input amplifiers are substantially identical.

6. The memory component of claim 5, further comprising:
an adapting network connected between the connecting contact of the first power input and another connecting contact for a ground potential to adapt the transfer function of the first power input to the transfer functions of the signal inputs.

7. The memory component of claim 6, further comprising:
a reference signal input which comprises a further connecting contact for a reference potential; and
a further adapting network connected between the further connecting contact of the reference signal input and the first connecting contact to adapt the transfer function of the reference signal input to one of the transfer functions of the first power input and of the signal inputs.

8. The memory component of claim 7, wherein at least one of a part of the adapting network and a part of the further adapting network is integrated together with the input amplifiers on one semiconductor substrate.

9. The memory component of claim 7, wherein at least one of a part of the adapting network and a part of the further adapting network, together with the input amplifiers, is arranged in one package.

10. A memory component, comprising:
a memory cell array;
a plurality of signal inputs;
a plurality of input amplifiers, respectively connected to the plurality of signal inputs, for receiving, amplifying and outputting at least one of data signals, address signals and control signals;
a data/address/control signal generator for the memory cell array;
a first supply network for supplying power to the input amplifiers; and
a second supply network for supplying power to the data/address/control signal generator;
wherein the first supply network and the second supply network are constructed as separate supply networks; and
wherein each input amplifier includes an input connection which is connected via a resistor to a reference connecting contact of a reference signal input and via a capacitor to a ground connecting contact for a ground potential, and wherein each signal input includes a signal connecting contact, the capacitors being respectively dimensioned in such a manner that transfer functions for signal paths via the reference connecting contact to the input amplifiers and via the signal connecting contacts of the signal inputs to the input amplifiers are substantially identical.

11. An memory component, comprising:
a memory cell array;
a plurality of signal inputs;
a plurality of input amplifiers connected respectively to the signal inputs, for receiving, amplifying and outputting one of data, address and control signals;
a data, address or control signal generator for the memory cell array;
a first supply network for supplying power to the input amplifiers;
a first external power input connected to the first supply network; and
a second supply network for supplying power to the data, address or control signal generator, the first supply network and the second supply network being constructed as separate supply networks,
wherein signal paths from signal inputs to the input amplifiers and a signal path from the first external power input via the first supply network to the input amplifiers exhibit identical transfer functions for a transmission of signals to the input amplifiers from outside of the memory component.

12. The memory component of claim 11, further comprising:

a first adapting network disposed in connection with the first supply network to adapt the transfer function of the first power input to the transfer functions of the signal inputs.

13. A memory component, comprising:
a signal input area comprising:
   a plurality of input amplifiers for receiving, amplifying and outputting one of data, address and control signals, each input amplifier connected to a respective signal input via a respective input inductance element; and
   a first supply network for supplying power to the input amplifiers; and a core/logic area comprising:
   a memory cell array;
   a data, address or control signal generator for the memory cell array; and
   a second supply network for supplying power to the data, address or control signal generator;
wherein the first supply network and the second supply network are constructed as separate supply networks;
wherein the first supply network comprises:
a first potential rail connected via a first input inductance element to an external ground connection;
a second potential rail connected via a second input inductance element to an external supply connection;
a third potential rail connected via a third input inductance element to a reference supply connection; and
for each input amplifier, a resistive element connected between a reference input of the input amplifier and the third potential rail and a capacitive element connected between the reference input and the first potential rail.

14. The memory component of claim 13, wherein the second supply network comprises:
   a fourth potential rail connected via a fourth input inductance element to the external ground connection; and
   a fifth potential rail connected via a fifth input inductance element to the external supply connection.

15. The memory component of claim 14, wherein the inductance elements, the resistive elements and the capacitive elements are dimensioned in such a manner that transfer functions for transmission of signals to the input amplifiers from outside of the memory component via the signal inputs and via the first supply network are substantially identical.

16. The system of claim 15, further comprising:
   a first adapting network disposed between the first potential rail and the second potential rail; and
   a second adapting network disposed between the first potential rail and the third potential rail;
   wherein the adapting networks are configured to adapt the transfer function of the reference signal input to one of the transfer functions of the first power input and of the signal inputs.

* * * * *